United States Patent [19]
Skrovan et al.

[11] Patent Number: 5,916,819
[45] Date of Patent: Jun. 29, 1999

[54] PLANARIZATION FLUID COMPOSITION CHELATING AGENTS AND PLANARIZATION METHOD USING SAME

[75] Inventors: John Skrovan; Scott Meikle, both of Boise, Id.

[73] Assignee: Micron Technology, Inc., Boise, Id.

[21] Appl. No.: 08/682,308

[22] Filed: Jul. 17, 1996

[51] Int. Cl.$^6$ .................................................. H01L 21/302
[52] U.S. Cl. .......................... 438/692; 216/89; 438/693
[58] Field of Search ...................... 216/88, 89; 438/692, 438/693

[56] References Cited

U.S. PATENT DOCUMENTS

| | | | |
|---|---|---|---|
| 4,193,226 | 3/1980 | Gill, Jr. et al. | 51/124 R |
| 4,811,522 | 3/1989 | Gill, Jr. | 51/131.1 |
| 4,963,283 | 10/1990 | Lapham et al. | 252/79.3 |
| 5,290,361 | 3/1994 | Hayashida et al. | 134/2 |
| 5,366,542 | 11/1994 | Yamada et al. | 106/3 |
| 5,421,769 | 6/1995 | Schultz et al. | 451/287 |

FOREIGN PATENT DOCUMENTS

| | | |
|---|---|---|
| 39 39 661 | 6/1991 | Germany . |
| 3939661 | 6/1991 | Germany . |
| 3-256665 | 11/1991 | Japan . |

OTHER PUBLICATIONS

"Determination of the Composition of Viscous Liquid Film on Electropolishing Copper Surface By XPS and AES"; Fang et al.; J. Elect. Soc; 1989; 136 (12); pp. 3800–3803.

Akiya et al., "Thin–Oxide Dielectric Strength Improvement by Adding a Phosphonic Acid Chelating Agent into $NH_4OH–H_2O_2$ Solution," *J. Electrochem. Soc.,* 141(10), L139–L142 (1994).

Ernsberger, "Attach of Glass by Chelating Agents," *Journal of the American Ceramic Society,* 42(8), 373–375 (1959).

*Primary Examiner*—William Powell
*Assistant Examiner*—George Goudreau
*Attorney, Agent, or Firm*—Mueting, Raasch & Gebhardt, P.A.

[57] ABSTRACT

A planarization method including the provision of a wafer having a wafer surface. A pad is positioned for contact with the wafer surface and the wafer surface is planarized using the pad and a fluid composition that includes a chelating agent. The chelating agent is a water soluble multidentate chelating agent, preferably a water soluble bidentate ionic chelating agent, and more preferably 1,2-ethylenediphosphonic acid (EDP). A fluid composition for use in planarization of a surface of a wafer includes a chemically interactive component that interacts with the surface of the wafer and a chelating agent for reducing the metal ion contamination of the wafer during planarization. The chelating agent may be one of a water soluble multidentate chelating agent, preferably a water soluble bidentate ionic chelating agent, and more preferably 1,2-ethylenediphosphonic acid (EDP). Further, the fluid composition may include an abrasive component.

5 Claims, 17 Drawing Sheets

5,916,819

PLANARIZATION FLUID COMPOSITION CHELATING AGENTS AND PLANARIZATION METHOD USING SAME

FIELD OF THE INVENTION

The present invention pertains to planarization fluid compositions and planarization methods in the fabrication of semiconductor devices. More particularly, the present invention is directed to the use of chelating agents in such fluid compositions and methods.

BACKGROUND OF THE INVENTION

A large fraction of yield losses in wafer fabrication or processing of semiconductor devices is attributed to microcontamination. Contaminants can be organic or inorganic particles, films or molecular compounds, ionic materials, or atomic species. Examples of ionic contaminants are sodium, potassium, lithium, calcium, boron, manganese, sodium, titanium, zirconium, aluminum, sulfur and magnesium. Other damaging elemental impurities include heavy metals, for example, such as iron, copper, nickel, and gold.

The presence of contaminants during wafer processing has become particularly problematic in high density, large scale integration (LSI) technology. For example, contaminants can cause a device to fail by improperly defining patterns, creating unpredictable surface topography, inducing leakage currents through insulating layers, or accelerating device wearout.

Silicon wafers may be exposed to metallic or semimetallic contaminants during, for example, chemical mechanical planarization or polishing (CMP) or during other cleaning operations. CMP may, for example, involve holding or rotating a wafer of semiconductor material against a wetted polishing surface under controlled chemical fluid (i.e. slurry), pressure, and temperature conditions. The fluid typically consists of an abrasive component such as alumina or silica (unless it is utilized with a pad including an abrasive component) and a chemical etchant that chemically interacts with the surface. Generally, such fluid or slurries are quite pure; however, they are not free of contaminants such as the ionic contaminants listed above.

Chemical-mechanical planarization or polishing may be used to produce a surface with the desired end point or thickness. However, metal ions create contamination problems. For example, such contaminants may diffuse into the surface of the wafer and down fracture paths.

It has been reported that phosphonic acid chelating agents added to SC-1 wet cleaning solution (a mixture of $NH_4OH$, $H_2O_2$, and $H_2O$) of an RCA clean commonly used to remove particles and organic contaminants on silicon surfaces, reduces certain metallic contamination deposition on a silicon wafer. This conclusion was reached in the article entitled "Thin-Oxide Dielectric Strength Improvement by Adding a Phosphonic Acid Chelating Agent into $NH_4OH$—$H_2O_2$ Solution" by Akiya et al., *J. Electrochem. Soc.*, Vol.141, No. 10, October 1994. However, such wet cleaning procedures are performed after CMP processing and contamination may have already caused significant contamination problems to the wafer during the CMP process.

For the above reasons, improvements in the CMP process to reduce metal ion contamination of the wafer being processed are needed. The present invention as described below provides such improvements and overcomes the problems described above and those problems which will become apparent to one skilled in the art from the detailed description below.

SUMMARY OF THE INVENTION

The planarization method of the present invention includes providing a wafer having a wafer surface. A pad is positioned for contact with the wafer surface and the wafer surface is planarized using the pad and a fluid composition including a chelating agent. The chelating agent may be one of any water soluble multidentate chelating agent, preferably a water soluble bidentate ionic chelating agent, and more preferably 1,2-ethylenediphosphonic acid (EDP). Further, in one embodiment, the fluid composition may include an abrasive component and in another embodiment, the pad may include an abrasive component.

A fluid composition for use in planarization of a surface of a wafer in accordance with the present invention includes a chemically interactive component that interacts with the surface of the wafer during planarization and a chelating agent for reducing the metal ion contamination of the wafer during planarization. The chelating agent may be one of any water soluble multidentate chelating agent, preferably a water soluble bidentate ionic chelating agent, and more preferably 1,2-ethylenediphosphonic acid (EDP). In one embodiment, the fluid composition also includes an abrasive component.

DETAILED DESCRIPTION OF THE EMBODIMENTS

The present invention is directed to methods of planarization and in particular to planarization using a fluid composition including a quantity of a chelating agent. The fluid composition of the present invention, including the chelating agent is used in planarizing or polishing wafers being fabricated to reduce the amount of metal ion contaminants left on the wafer after the CMP process is completed. The target metal ion contaminants of which the present invention is beneficial in reducing, include, for example: the alkali metals such as sodium (Na), potassium (K) and Lithium (Li); alkaline earth metals such as magnesium (Mg) and calcium (Ca); heavy metals such as iron (Fe), nickel (Ni), and zinc (Zn); and any other metal ion contaminants including, for example, aluminum (Al), chromium (Cr), manganese (Mn), titanium (Ti), boron (B), zirconium (Zr), and copper (Cu), any other metallic ion or any other contaminant that would form a ligand forming complex.

Figure 1A:
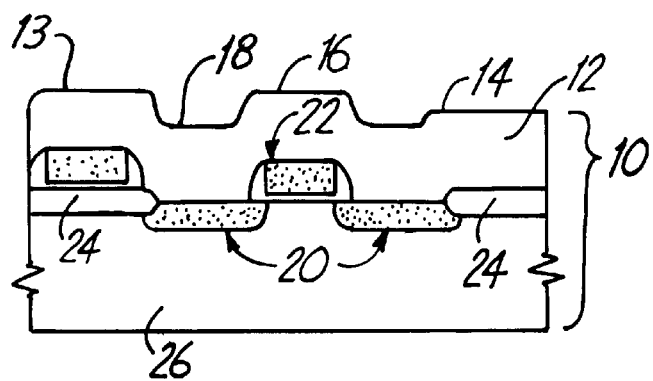
FIG. 1A and 1B are cross-sectional illustrations of a part of a wafer before and after a planarization process has been performed in accordance with the present invention.

FIG. 1A illustrates a portion of a wafer 10 prior to planarization by chemical-mechanical polishing (CMP) in accordance with the present invention. The wafer portion 10 includes a substrate 26 having junctions 20 formed thereon. Isolation areas 24 are also formed on substrate 26 with polysilicon 22 deposited thereon. Over these elements formed on substrate 26, a film of borophosphosilicate glass (BPSG) 12 is formed, and, such as by reflow, the glass 12 conformably covers steps, fills gaps between polysilicon lines, and forms an upper surface having different heights such as at areas 14, 16, and 18. The nonplanar upper surface 13 of BPSG film 12 is the surface having non-uniformities which can be reduced or eliminated when subjected to planarization in accordance with the present invention with reduced metal ion contamination to the wafer.

FIG. 1A is shown only to illustrate a surface having nonuniformities in need of planarization for the fabrication of semiconductor devices. Other surfaces, including but not limited to other dielectrics, polysilicon, oxide filled trenches, various metal films, other doped oxides, spin on glasses, or any other fabricated surface which may require planarization as is known to one skilled in the art may benefit from the present invention. Therefore, the present invention is not limited to the planarization of any particular surface, but is limited only in accordance with the invention as described in the accompanying claims.

Figure 1B:
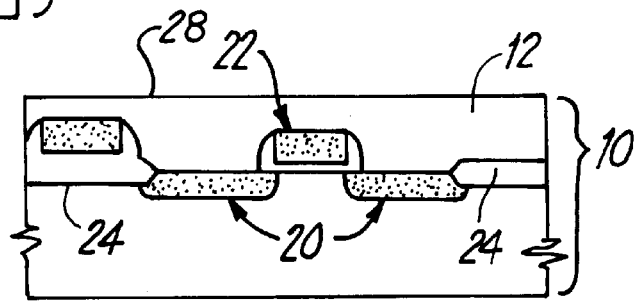

FIG. 1B illustrates the wafer portion 10 shown in FIG. 1A after the upper surface 13 of the BPSG film 12 has been planarized in accordance with the present invention. The resulting wafer 10 includes an upper surface 28 planarized or polished such that the thickness of the wafer 10 is substantially uniform across the entire wafer 10. As will be described further below, the present invention provides for a uniformly thick wafer with reduced metal ion contamination. The reduced metal ion contamination of the wafer using a fluid composition including a chelating agent as described herein is shown by the reduced ion concentration levels as reported in the Examples herein.

The present invention is not limited to use with nonplanar surfaces, such as that shown in FIG. 1A. The present invention is also beneficial for use with substantially planar surfaces such as the surface 28 shown in FIG. 1B. For example, the slurry and method of planarization in accordance with the present invention is beneficial during the whole planarization process. As such, the benefits are applicable to both nonplanar and planar surfaces and furthermore through the entire planarization process.

Figure 2:
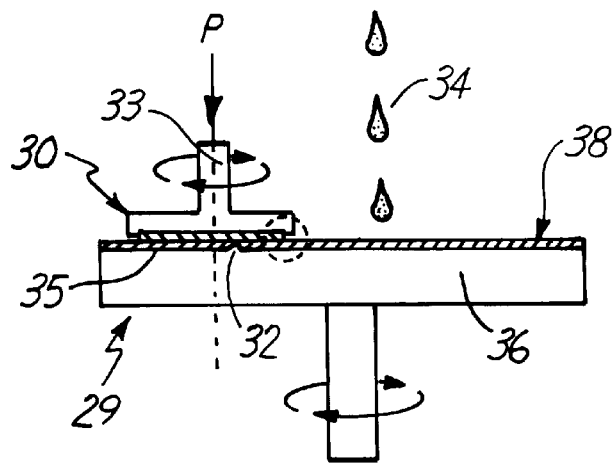
FIG. 2 is a general diagrammatical illustration of a chemical-mechanical polishing or planarization apparatus utilized in accordance with the present invention.

FIG. 2 is a diagrammatical illustration showing one embodiment of a CMP process for planarization of surfaces of semiconductor wafers in accordance with the present invention. As shown in FIG. 2, the present invention utilizes a planarization assembly 29 such as Model 372 or Model 472 available from IPEC/Westech. Other planarization assemblies or units for performing CMP methods are readily available and are clearly contemplated by the scope of the present invention as described in the accompanying claims. For example, the planarization process may be performed with the apparatus described in U.S. Pat. No. 5,421,769, entitled "Apparatus For Planarizing Semiconductor Wafers, and a Polishing Pad for a Planarization Apparatus" and herein incorporated by reference; U.S. Pat. No. 4,193,226 entitled "Polishing Apparatus" and herein incorporated by reference; U.S. Pat. No. 4,811,522 entitled "Counterbalanced Polishing Apparatus" and herein incorporated by reference; and any other planarization assembly as known to those skilled in the art. Various other embodiments of planarization assemblies are known and available for use with the present invention. For example, some planarization units do not use rotating platens and rotating wafer holders. The present invention is inclusive of all planarization units for which the present invention provides benefit.

Figure 3:
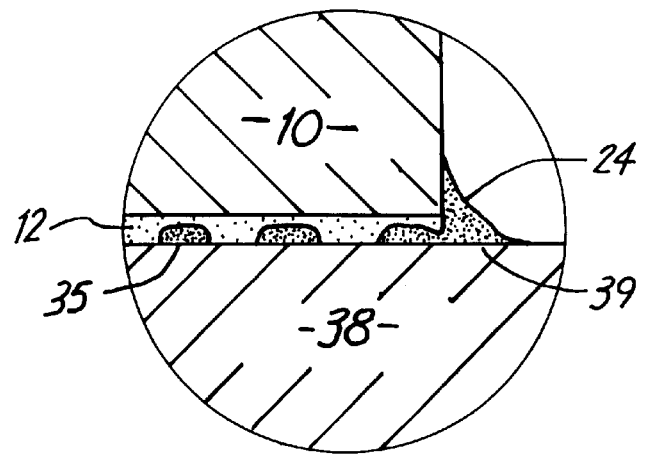
FIG. 3 is an enlarged view of a portion of the dashed circle area of FIG. 2.

The general illustrative planarization assembly, as shown in FIG. 2, for performing CMP in accordance with the present invention, includes a rotating wafer holder 30 that holds wafer 32 of which wafer portion 10 is a part thereof A fluid composition 34 in accordance with the present invention is introduced atop a polishing pad 38. The polishing pad 38 is located on a rotating table platen 36. The polishing pad 38 is applied to the surface 12 of wafer 10 in the presence of the fluid composition 34 at a certain pressure to perform the planarization as is shown in the detail drawing of FIG. 3. The pressure applied is represented in FIG. 2 by the arrow mark "P"; this pressure P represents both down force pressure and backside pressure applied per a planarization assembly, such as an assembly available from IPEC/Westech. The rotating elements 30, 36 are rotated and moved by motors or drive means (not shown) as is readily known to those skilled in the art.

Wafer holder 30 rotates wafer 32 at a selected velocity about an axis 33 and moves wafer 32 under controlled pressure P across pad 38. The wafer 32 contacts the pad 38 as it is moved. The area of the pad 38 which comes into contact with the surface 12 of the wafer 32 varies as the wafer 32 is moved in a predetermined pattern as is known to those skilled in the art.

A chemical supply system (not shown) introduces a fluid composition 34 atop the pad 38 at a specified flow rate. The fluid composition 34 may be introduced at various locations about the pad without affecting the benefits of the present invention. For example, the fluid composition 34 may be introduced from above the pad 38, such as by drip, spray, or other dispensing means and further may be introduced from beside the rotating table 36 by spraying or other dispensing means.

The rotating table 36 is rotated at a selected velocity and is rotated in the same direction as the wafer holder 30. The surface 12 of the wafer 32 is held in juxtaposition relative to the pad 38 so that the pad 38 can planarize or polish surface 12. The fluid composition and the pad pressure primarily determine the polishing rate or rate of removal of the surface material.

To alleviate metallic contamination during the planarization process, the present invention performs planarization in the presence of the fluid composition including a chelating agent. The chelating agent contains donor atoms that combine by coordinate bonding with a metal ion to form a chelating complex, or simply a chelate. The fluid composition in accordance with the present invention includes a fluid component and a chelating agent.

The fluid composition may include a conventional slurry component generally including an abrasive component and a component that chemically interacts with the surface 12. For example, a typical oxide polishing slurry may consist of a colloidal suspension of oxide particles, with an average size of, for example 120 nm, in an alkali solution having a pH greater than or equal to 9. Ceria ($CeO_2$) suspensions may also be used when appropriate, particularly where large amounts of $SiO_2$ must be removed. Ceria acts as both the chemical and mechanical agent in the slurry. Other abrasive components of the slurry component may include, but are not limited to, alumina ($Al_3O_2$), silica, zirconium oxide ($ZnO_2$), titania ($TiO_2$), or any other abrasive used in conventional planarization slurries as is known to one skilled in the art.

Several slurry solutions presently available include ILD1300, an aqueous fumed silica slurry including amorphous silica and ammonium hydroxide, available from Rodel, Inc., Newark, Del., and SC-1, a colloidal fumed silica aqueous slurry including amorphous silicon dioxide, DI water, and potassium hydroxide, available from Cabot Corp. Tuscola, Ill. under the trade designation CAB-O-SPERSE SC-1. General characteristics of suitable conventional slurry components utilized in conjunction with the present invention include that the hardness of the polishing particles or abrasive component should be about the same hardness as the hardness of the film being polished to avoid damaging the film. In addition, the particles should be uniform and the solution free of metallic contaminants. Further, for example, conventional planarization slurries having a pH greater than about 9 are used for oxide polishing processes and those less than a pH of about 4 are used in polishing processes of, for example, tungsten. The conventional slurry used is dependant upon the type of surface being polished.

The present invention may also be utilized with planarization units using pads including abrasive components wherein the fluid composition includes the chelating agent and a fluid component that chemically interacts with the surface. Therefore, the slurry including an abrasive component is not needed as the abrasive component of a slurry is provided by the pad that has an abrasive component at a surface thereof. The chemical interacting fluid component however, would still be required. The fluid chemically interacting component may include, for example, ammonium hydroxide or any alkali solution having a pH greater than or equal to 9.

A suitable chelating agent may be any water soluble multidentate molecular ligand (having two or more donor atoms in the molecule) capable of occupying more than one position in the coordination sphere of a metal ion to form a cyclic structure, referred to as the chelating complex or the chelate. For example, the chelating agents may have donor atoms that may include N, O, S, P, As, and Se and most of the donor atoms are contained in linear or branched-chain structures, separated by suitable numbers of other atoms to allow the formation of the chelate structure with the metal. Such multidentate chelating agents include, for example, ethylenediaminetetracetic acid (EDTA), and trimethylenetetramene (trien). Preferably, the chelating agents are bidentate ionic groups, either acidic or base, such as, for example, 1,2-ethylenediphosphonic acid (EDP). Most preferably, the chelating agent is EDP available from Lancaster Synthesis Ltd., Windham, N.H.

Also preferably, the chelating agent is one that forms a chelate or chelating complex that has a large conditional formation or stability constant $K_f$ with regard to the various metals of greatest concern during planarization. Each chelating agent has a $K_f$ that is different with respect to each metal. The formation constant is the equilibrium constant for the formation of the chelate complex from the solvated metal ion and the ligand in its fully dissociated form. Many parameters influence stability, including the size and number of chelate rings formed between the ligand and metal ion, substituents on the chelate rings, and the nature of the metal ions and donor atoms of the chelating agent. Suitable chelating agents are agents which have sufficiently high formation constants with respect to particular metal ions such as those known to be at the surface of the wafer during the use of a slurry for planarization. With the use of such chelating agents having high formation constants for these particular metal ions, the concentration of uncomplexed metal ions can be reduced to prevent contamination of the wafer during planarization. Two or more metal ions may be buffered at different concentrations by a single chelating agent, because as discussed above, the single chelating agent will typically have different stability or formation constants for different metals.

Because the formation constants are different with respect to different metal ions for a single chelating agent, preferable ranges for $K_f$ are given with respect to the metal ions of greatest concern. Preferably, the chelating agents have a $K_f$ greater than 3 for such metal ions of greatest concern. Particularly, the metal ions of greatest concern include Na, K, Li, Mg, Ca, Fe, Zn, and Al. For example, EDTA has a $K_f$ of 8.7 with respect to Mg, a $K_f$ of 10.7 with respect to Ca, a $K_f$ of 14.3 with respect to Fe(+2), a $K_f$ of 25.1 with respect to Fe(+3), a $K_f$ of 16.5 with respect to Zn, and a $K_f$ of 18.8 with respect to Cu. Further, for example, trien has a $K_f$ of 4.9 with respect to Mg, a $K_f$ of 7.8 with respect to Fe(+2), a $K_f$ of 12.1 with respect to Zn, and a $K_f$ of 20.4 with respect to Cu.

The benefits of using the chelating agent are not affected by the type or material of the polishing pad utilized. For example, the fluid composition may be utilized with any known and appropriate polishing pad as would be known to one skilled in the art because the choice of pads is application dependant. For example, suitable pads may include pads such as Model No. IC 1000, Model No. IC 60 and Polytech pads, all available from Rodel, Inc., Scottsdale, Ariz. The polishing pad 38 may include one or more pads; may be of specific shape, i.e. circular, oval, or rectangular; may be of a nonuniform shape; and may be of any particular hardness depending on the particular application. Further, as described above, the pads may be pads that include an abrasive component at a surface thereof for planarization.

Metal ion contamination of wafers occurs in several different modes. For example, metal ions in the slurries may bulk diffuse into a surface of a wafer. Alternatively, metal ions may diffuse down fracture paths of the wafer.

The chelating agent, such as 1,2-ethylenediphosphonic acid (EDP), is added to the conventional abrasive slurry, or to a fluid component for use with a pad that includes an abrasive component, to reduce the amount of metal ion contamination to the wafer. The chelating agent bonds to the metal ions and reduces the migration of metal contaminants into the wafer surface. The combination of the metal ion and chelating agent are slow to diffuse into the silicon wafer surface.

The amount of chelating agent used in the fluid composition is of an amount effective to reduce the concentration of metal ions in the fluid composition without impeding the polishing or planarization rate. Preferably, the chelating agent is present in an amount of about parts per billion (ppb) to about 5% by weight, more preferably about parts per million (ppm) to about 1% by weight, based upon the total weight of the fluid composition. As shown in the Examples below, the chelating agent EDP is present in the slurry in the amount of 2 grams to 5000 ml of slurry and in the amount of 0.2 grams to 2 gallons of the slurry.

The use of chelating agents for planarization is beneficial for the reduction of ion concentration as shown by the data of the Examples below. Benefits of the process shown include the concentration reduction of uncomplexed metal ions for at least one type of metal whenever the slurry with EDP is used. Preferably, concentration reduction with respect to more than one type of metal is desired; however, the reduction of just one metal is beneficial. Further, although it is preferable to obtain a high percentage reductions for at least one metal, even the slightest reduction of uncomplexed metal ions is beneficial.

EXAMPLE 1

In this Example 1, four wafers were subjected to planarization. The CMP process was performed using a Westech CMP planarization unit, Model 372, available from IPEC/Westech. The four wafers were planarized for 1 minute and 53 seconds. The wafers undergoing planarization were all run with a 5 psi downforce pressure utilizing the wafer holder or carrier, a 2 psi backside pressure utilizing the wafer table or platen, carrier rotation at 28 rpm, platen rotation at 33 rpm, a 100 ml/mm flowrate of the slurry, and a wafer table or platen temperature of about 115° F. All of the wafers were silicon wafers having BPSG deposited thereon; the BPSG layers being doped equally for each wafer and of a thickness of about 12,500 Å BPSG. Between the planarization of each wafer, a pad conditioning step was performed which includes running a diamond studded disc across the pad, for a time period of about 75 seconds, to refresh the pad surface. After planarization, the two (BPSG/Si) wafers, 10 and 13, were submitted for secondary ion mass spectrometry (SIMS) analysis to examine contamination as a function of the slurry with EDP and slurry without EDP. As is known to those skilled in the art, SIMS utilizes an energetic ion beam (1–10 kev) to remove material from a sample surface and a mass analyzer to determine the mass/charge ratio of the resulting ions. With respect to the other two wafers, 9 and 12, the oxide on the wafers was removed using a Vapor Phase Deposition (VPD) technique and then the effluent was subjected to atomic absorption in graphite furnace analysis (GFAA) which as known to those skilled in the art heats the effluent such that the spectral lines thereof can be used to determine ion concentrations. The ion concentration results from the GFAA analysis for Na, K, Li are shown with wafers 9 and 12 in Table 1. The results from the SIMS analysis are shown in the graphs as described with reference to FIGS. 4A–4C.

As shown in the Table 1 below, wafers 13 and 12 were planarized with a conventional slurry SC-1 without EDP and wafer 10 and 9 were planarized with a slurry including the combination of SC-1 containing EDP. The amount of EDP utilized in the SC-1 slurry included 2 grams of EDP per 5000 ml of SC-1 slurry.

TABLE 1

| Wafer No. | Polishing Pad | Abrasive Slurry | Concentration (atoms/cm$^2$) | | |
| --- | --- | --- | --- | --- | --- |
| | | | Na | K | Li |
| 12 | IC 60 | SC-1 | 2.06e12 | 2.13e12 | 1.85e11 |
| 9 | IC 60 | SC-1 + EDP | 2.03e11 | 1.31e12 | 2.43e11 |
| 13 | IC 60 | SC-1 | — | — | — |
| 10 | IC 60 | SC-1 + EDP | — | — | — |

As shown by the concentration levels of Table 1 for wafers 12 and 9, the Na concentration comparison shows reduced concentrations of Na in wafer #9 processed using EDP in the slurry, the K concentration comparison shows reduced concentrations of K in wafer #9 processed using EDP in the slurry, and the Li concentration comparison shows increased concentrations of Li in wafer #9 processed using EDP in the slurry. However, lithium GFAA analysis had not been optimized so errors in the Li numbers are likely.

Figure 4A:
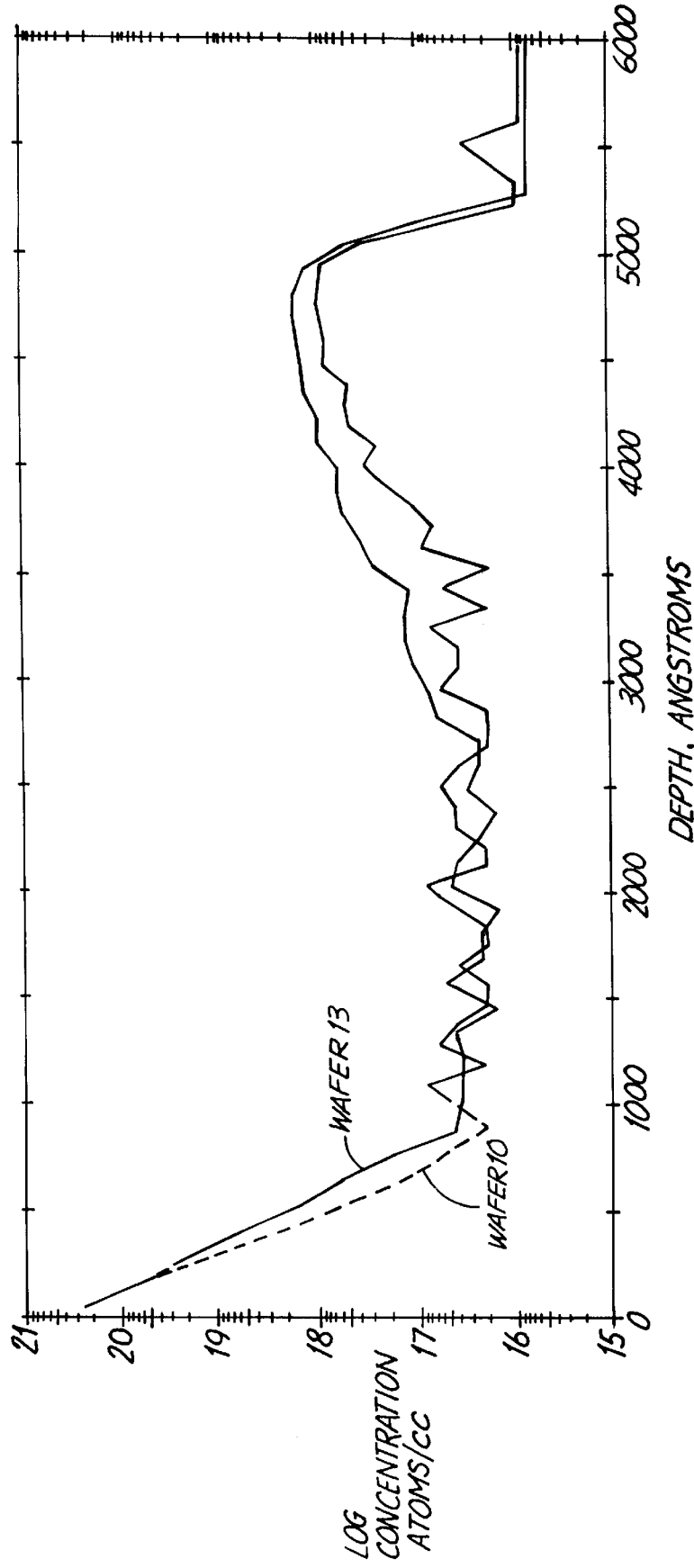
FIG. 4A–4D illustrate spectrographic concentrations of the metal ions Mg, K, Ca, and Na, respectively, for various wafers tested.

FIG. 4A–4D illustrate spectrographic concentrations of the metal ions Mg, K, Ca, and Na, respectively, at a level of 6000 angstroms into the surface of the wafer. It is believed that data below 1000 angstroms is not relevant because below this level there was most likely no penetration of metal ions during planarization using the slurries. The particularly relevant portions of the graphs show the concentration lines for the wafer which was planarized with the slurry having EDP therein as dashed lines and the concentration lines for the wafer that did not utilize EDP as solid lines. For example, as shown in FIG. 4A, the particularly relevant portion of the graph is from 0 to 1000 Å in which wafer #10 utilizing EDP is shown as dashed with wafer #13 shown as solid.

FIG. 4A is a magnesium concentration comparison showing reduced concentrations of Mg in wafer #10 processed using EDP in the slurry.

Figure 4B:
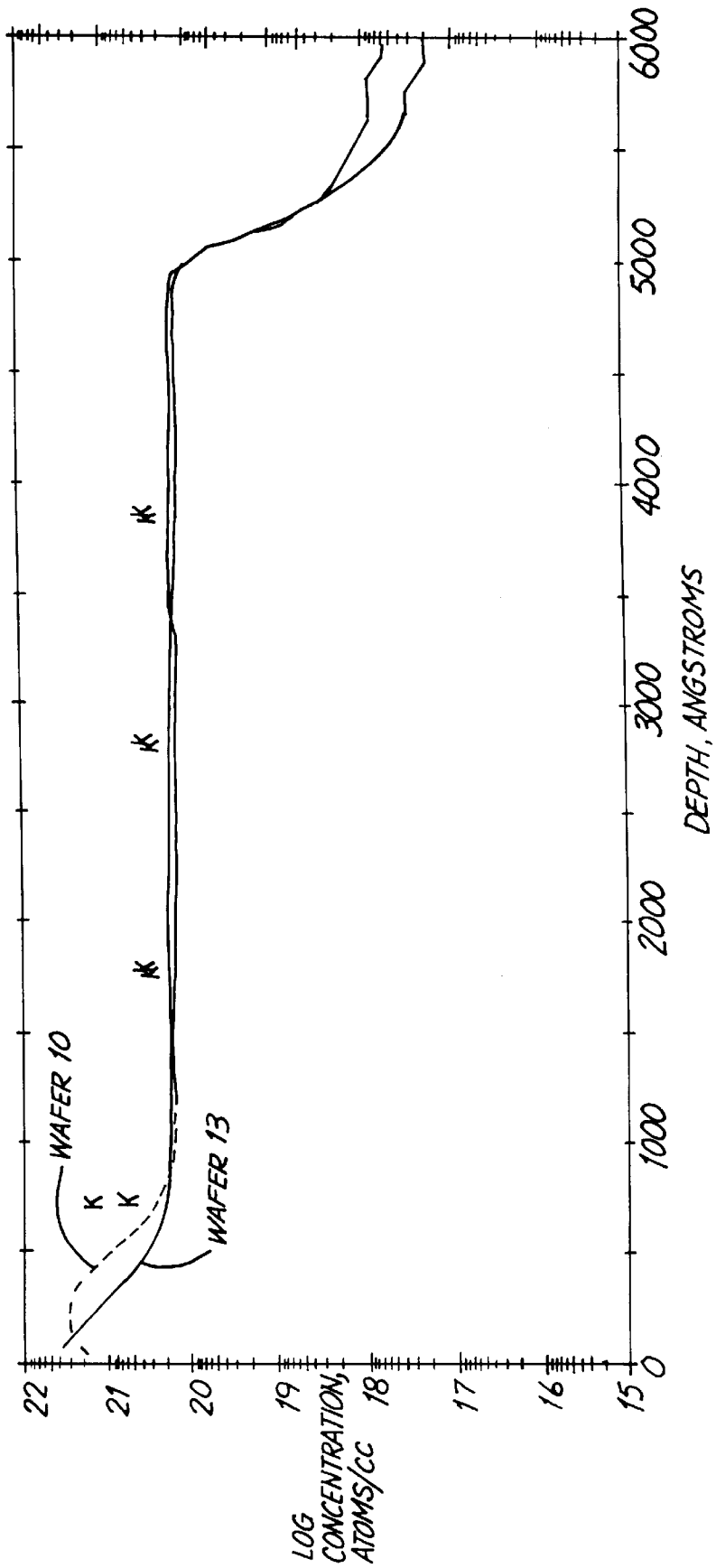

FIG. 4B is a potassium concentration comparison showing increased concentrations of K in wafer #10 processed using EDP in the slurry, but only after a very low or decreased concentration within the first few hundred angstroms.

Figure 4C:
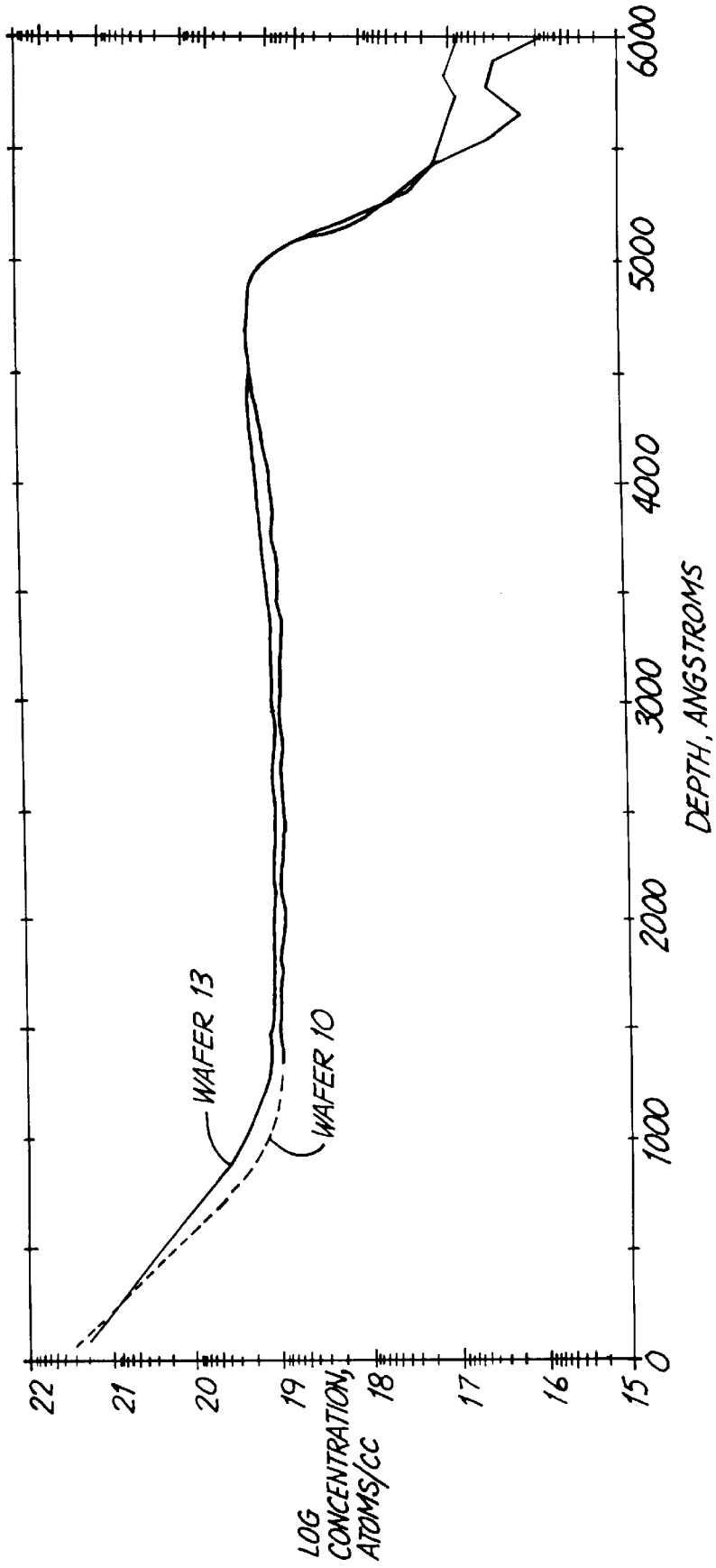

FIG. 4C is a calcium concentration comparison showing reduced concentrations of Ca in wafer #10 processed using EDP.

Figure 4D:
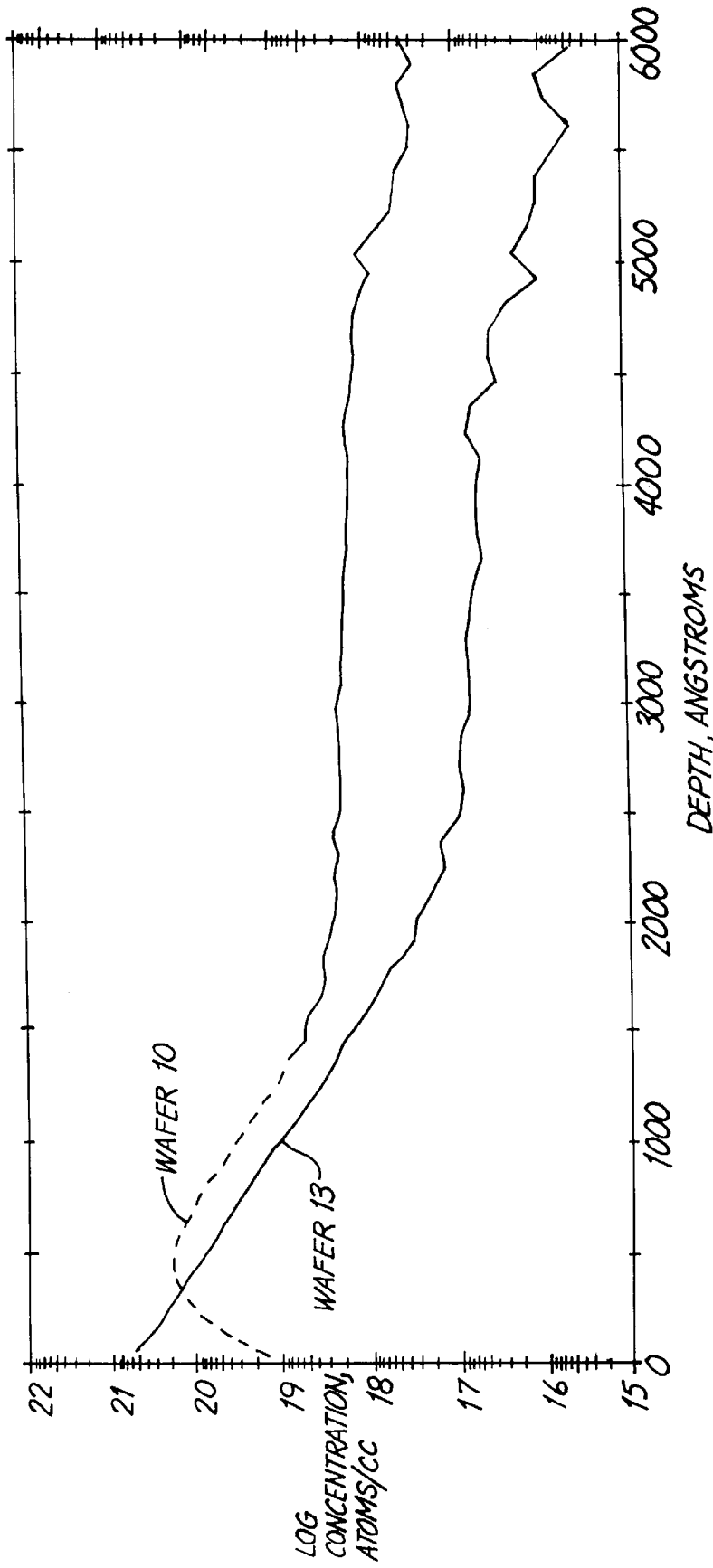

FIG. 4D is a sodium concentration comparison showing a lesser concentration of Na in wafer #10 processed using EDP than without EDP for the first few hundred angstroms. Although a sharp reduction is shown at the surface of the wafer but then an increased concentration is shown thereafter, it is possible that the overall background Na concentration of this wafer was higher than normal.

EXAMPLE 2

In this Example 2, eight wafers were subjected to planarization. The CMP process was performed using a Westech CMP planarization unit, Model 472, available from IPEC/Westech. All the wafers were planarized for 20 seconds. When the conventional slurries were utilized with EDP, the slurry included 0.2 grams of EDP per 2 gallons of conventional slurry. The wafers undergoing planarization were all run with a 5 psi downforce pressure utilizing the wafer holder, a 2 psi backside pressure utilizing the wafer table, wafer table or platen rotation at 33 rpm, carrier or holder rotation at 28 rpm, a 100 ml/mm flowrate of the slurry, and a wafer table or platen temperature of about 115° F. All of the wafers were silicon wafers having BPSG deposited thereon of about 3000 Å. The BPSG layers were doped equally for each wafer. Between the planarization of each wafer, a pad conditioning step was performed which includes running a diamond studded disc across the pad, for a time period of about 75 seconds, to refresh the pad surface. After planarization, the wafer was cleaned with DI water and a 1000 Å nitride cap was deposited thereon to prevent other contamination from affecting the results of the test. The eight wafers were submitted for secondary ion mass spectrometry (SIMS) analysis to study the effect of a chelating agent to reduce metal ion contamination.

Table 2 gives the matrix of the eight wafers submitted for analysis along with the concentration at the nitride/BPSG interface (1000 angstroms) for those elements which showed notable differences. Concentrations are given for comparison purposes only. Without implant standards into the sample matrix, only qualitative values may be obtained.

TABLE 2

| Wafer | Pad | Slurry | Time | CONCENTRATION (ATOMS/CC) | | |
|---|---|---|---|---|---|---|
| | | | | Na | Ca | Mg |
| 48 | IC 1000 | SC-1 | 20s | 2.4e19 | 1.2e20 | 1.6e19 |
| 24 | IC 1000 | SC-1 + EDP | 20s | 4.5e19 | 9.0e19 | 1.0e19 |
| 42 | IC 60 | ILD1300 | 20s | 1.2e19 | 8.0e19 | 4.0e18 |
| 34 | IC 60 | ILD1300 + EDP | 20s | 1.8e19 | 8.0e19 | 5.0e18 |
| 40 | IC 60 | SC-1 | 20s | 1.2e19 | 9.0e19 | 5.0e18 |
| 36 | IC 60 | SC-1 + EDP | 20s | 1.8e19 | 9.0e19 | 5.0e18 |
| 30 | IC 1000 | ILD1300 | 20s | 6.0e19 | 9.0e19 | 1.0e19 |
| 28 | IC 1000 | ILD1300 + EDP | 20s | 1.5e19 | 9.0e19 | 6.0e18 |

Figure 5A:
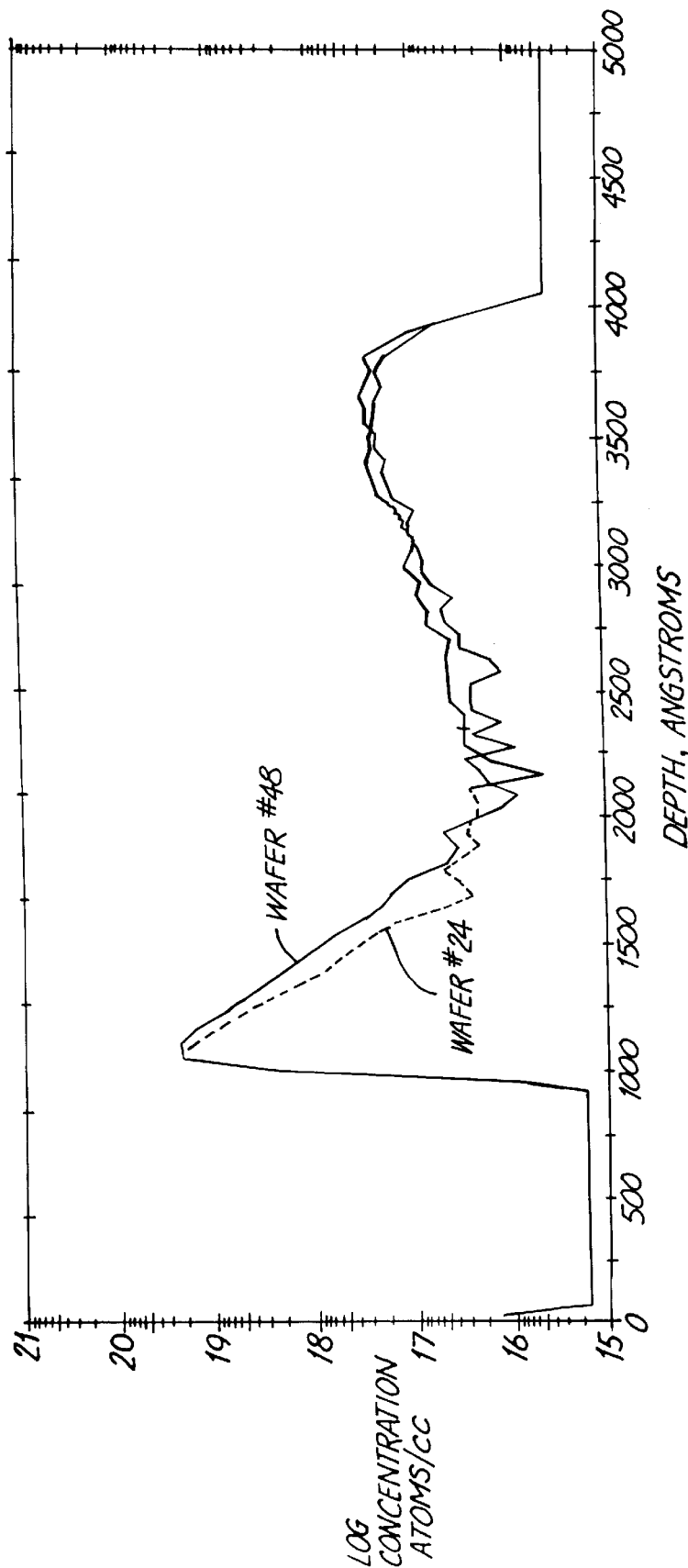
FIG. 5A–5C illustrate spectrographic concentrations of the metal ions Mg, Ca, and Na, respectively, for various wafers tested.

FIGS. 5A–5C, 6A–6C, 7A≠7C, and 8A–8C illustrate spectrographic concentrations of the metal ions Mg, Ca, and Na at a level to 5000 Å into the surface of the wafer. The first 1000 Å represents the nitride cap and does not present relevant information. Further, in most circumstances and as shown in the illustrations, after about 500 Å to 1000 Å into the BPSG surface the contamination is most likely background contamination as below these levels there was most likely no penetration of metal ions during the planarization using the slurry. Therefore, discussion below will focus on the relevant sections of the illustrations between about 1000 Å to about 2000 Å. The particularly relevant portions of the graphs show the concentration lines for the wafer which was planarized with the slurry having EDP therein as dashed lines and the concentration lines for the wafer that did not utilize EDP as solid lines. For example, as shown in FIG. 5A, the particularly relevant portion of the graph is from about 1000 Å to about 2000 Å in which wafer #24 utilizing EDP is shown as dashed with wafer #48 shown as solid. It should be noted that the results of this Example may vary from run to run due to the background noise associated with the procedure utilized.

Figure 5B:
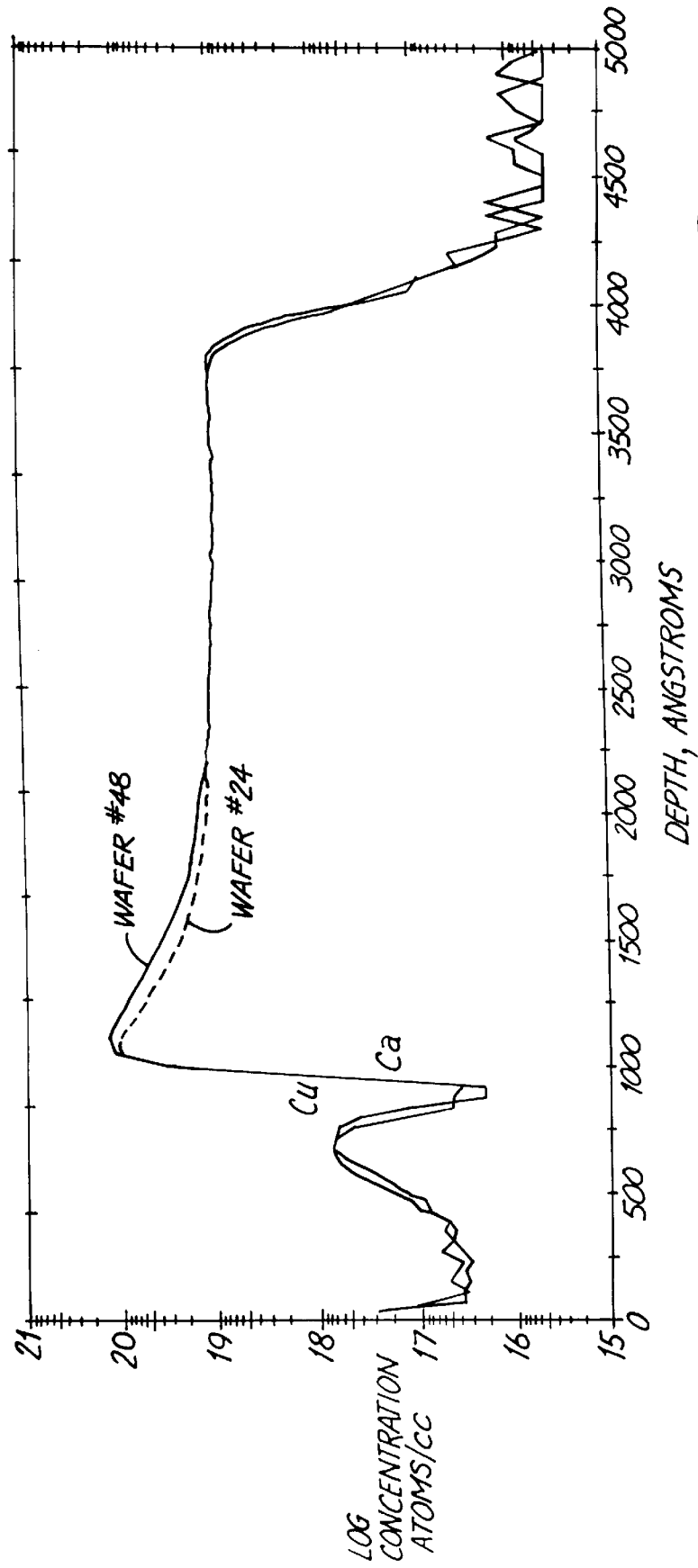
Figure 5C:
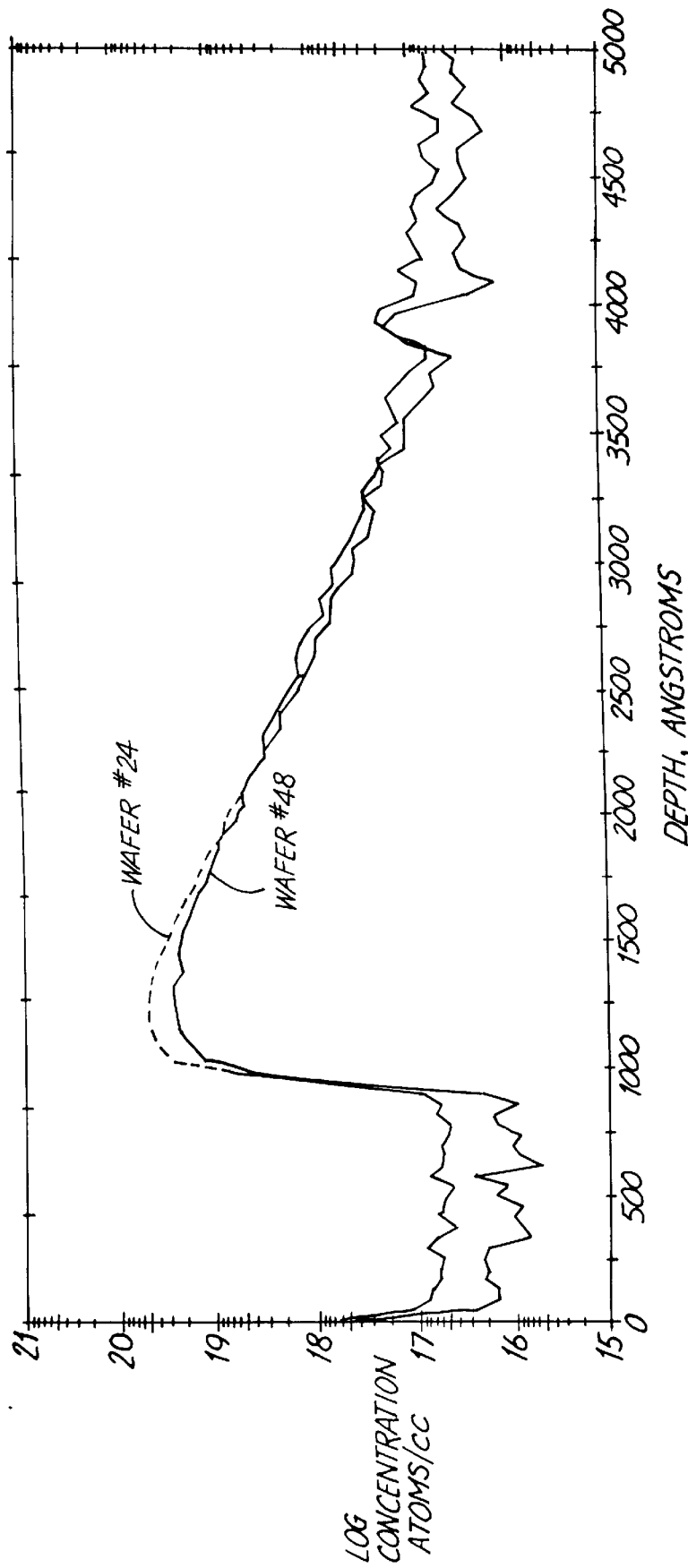

FIGS. 5A–5C graphically illustrates Mg, Ca, Na concentrations, respectively, for wafers #24 and #48. FIG. 5A is a Mg concentration comparison showing decreased concentrations of Mg in wafer #24 processed using a slurry including EDP in the relevant portion of the illustration. FIG. 5B is a Ca concentration comparison showing reduced concentrations of Ca in wafer #24 processed using EDP in the slurry. FIG. 5C is a Na concentration comparison showing increased concentrations of Na in wafer #24 processed using EDP in the slurry even in the nitride cap region of the illustration which may indicate Na contamination from a source after planarization and therefore producing results for this test that are inconclusive.

Figure 6A:
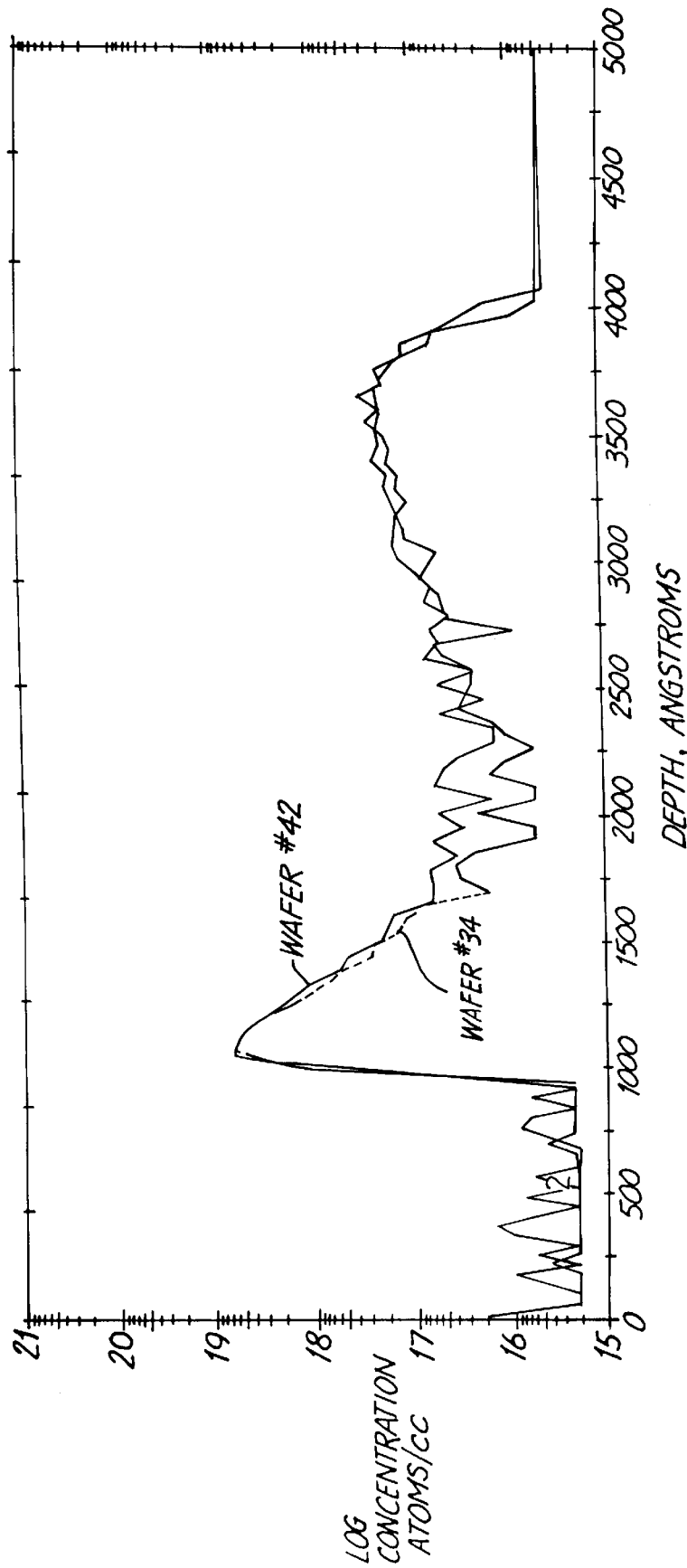
FIG. 6A–6C illustrate spectrographic concentrations of the metal ions Mg, Ca, and Na, respectively, for various wafers tested.
Figure 6B:
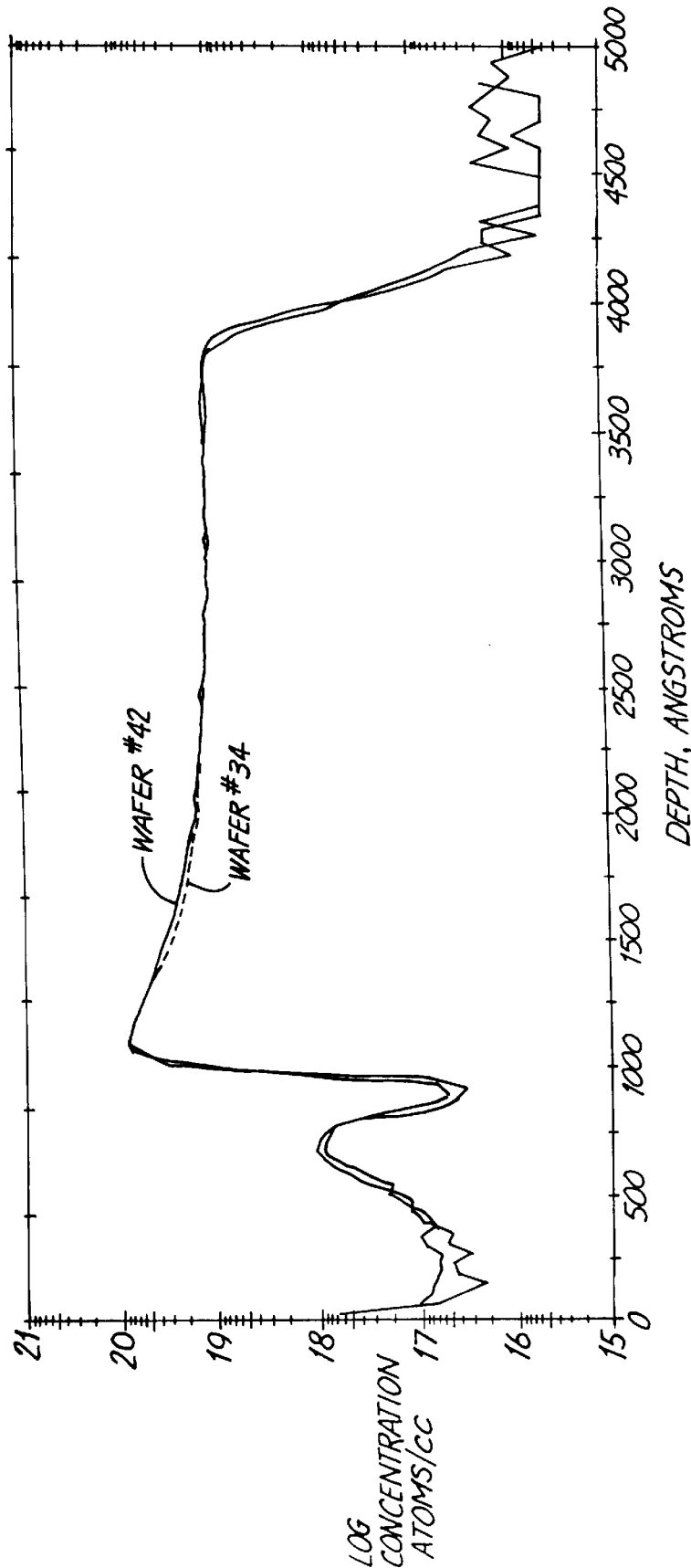
Figure 6C:
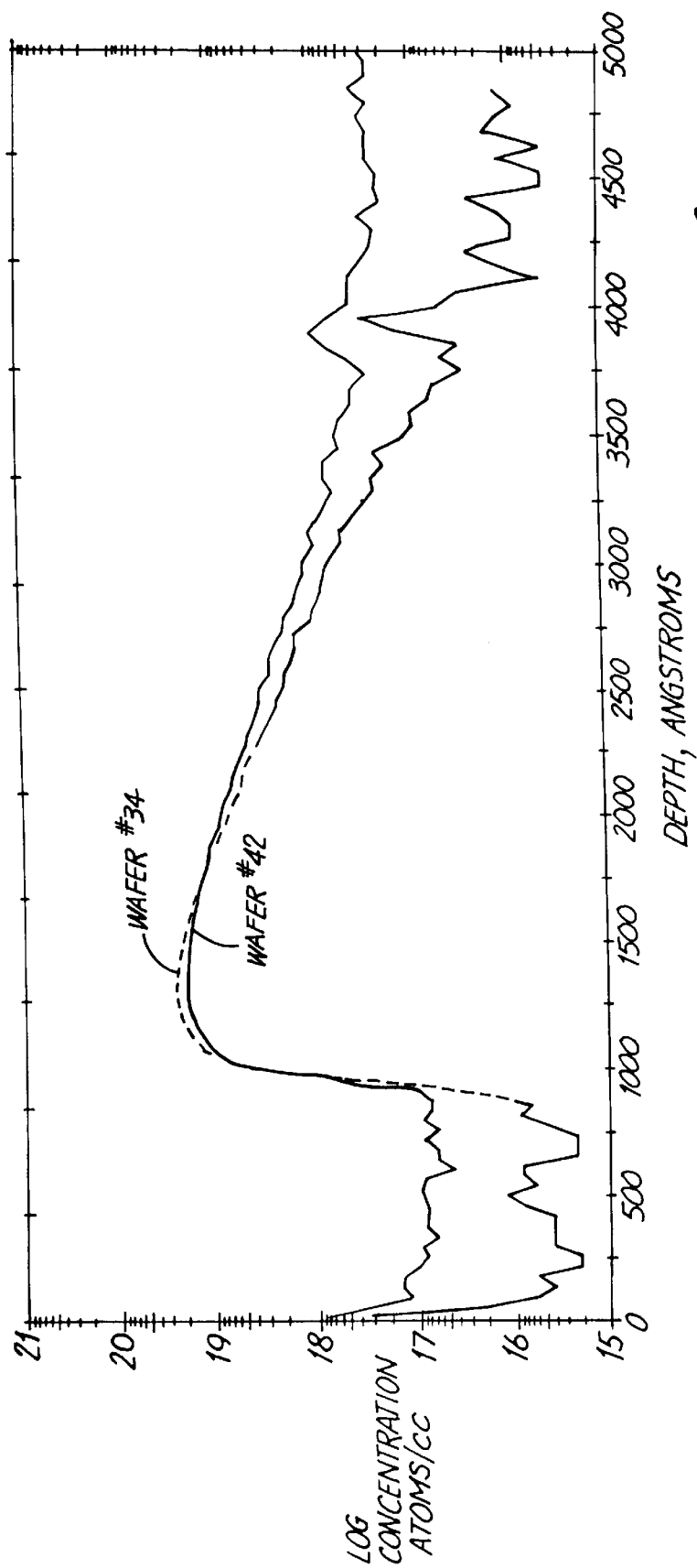

FIGS. 6A–6C graphically illustrates Mg, Ca, Na concentrations, respectively, for wafers #34 and #42. FIG. 6A is a Mg concentration comparison showing reduced concentrations of Mg in wafer #34 processed using EDP in the slurry. FIG. 6B is a Ca concentration comparison showing substantially equal concentrations of Ca in wafer #34 and #42. FIG. 6C is a Na concentration comparison showing a increased concentration of Na in wafer #34 processed using EDP in the slurry.

Figure 7A:
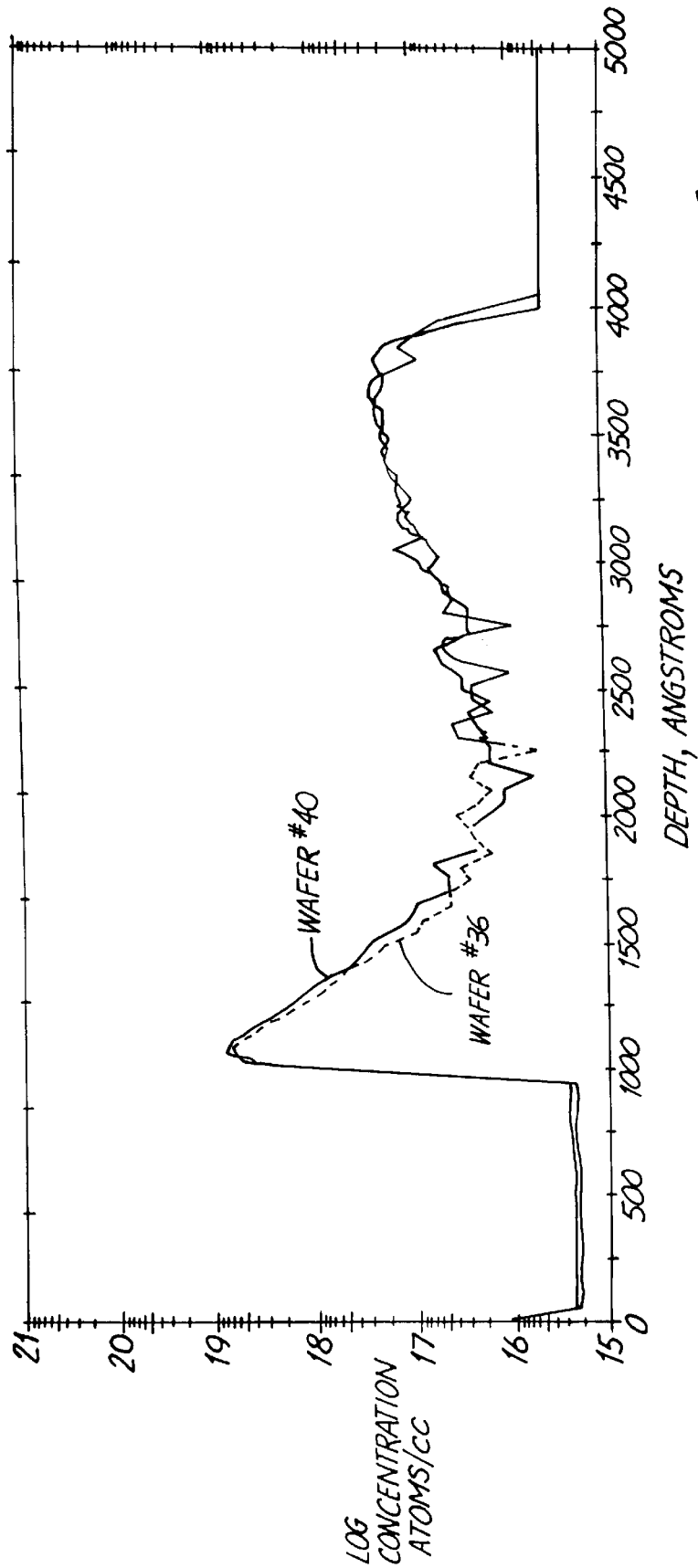
FIG. 7A–7C illustrate spectrographic concentrations of the metal ions Mg, Ca, and Na, respectively, for various wafers tested.
Figure 7B:
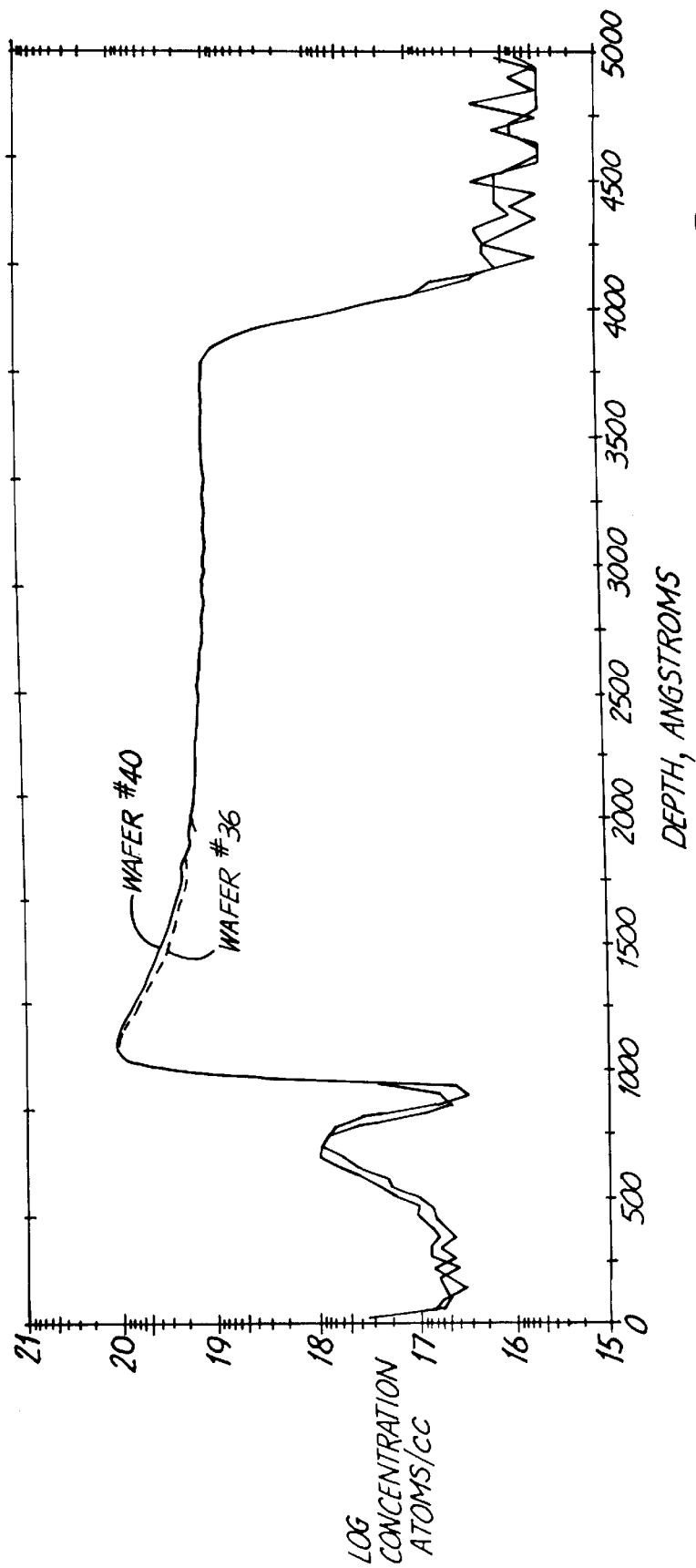
Figure 7C:
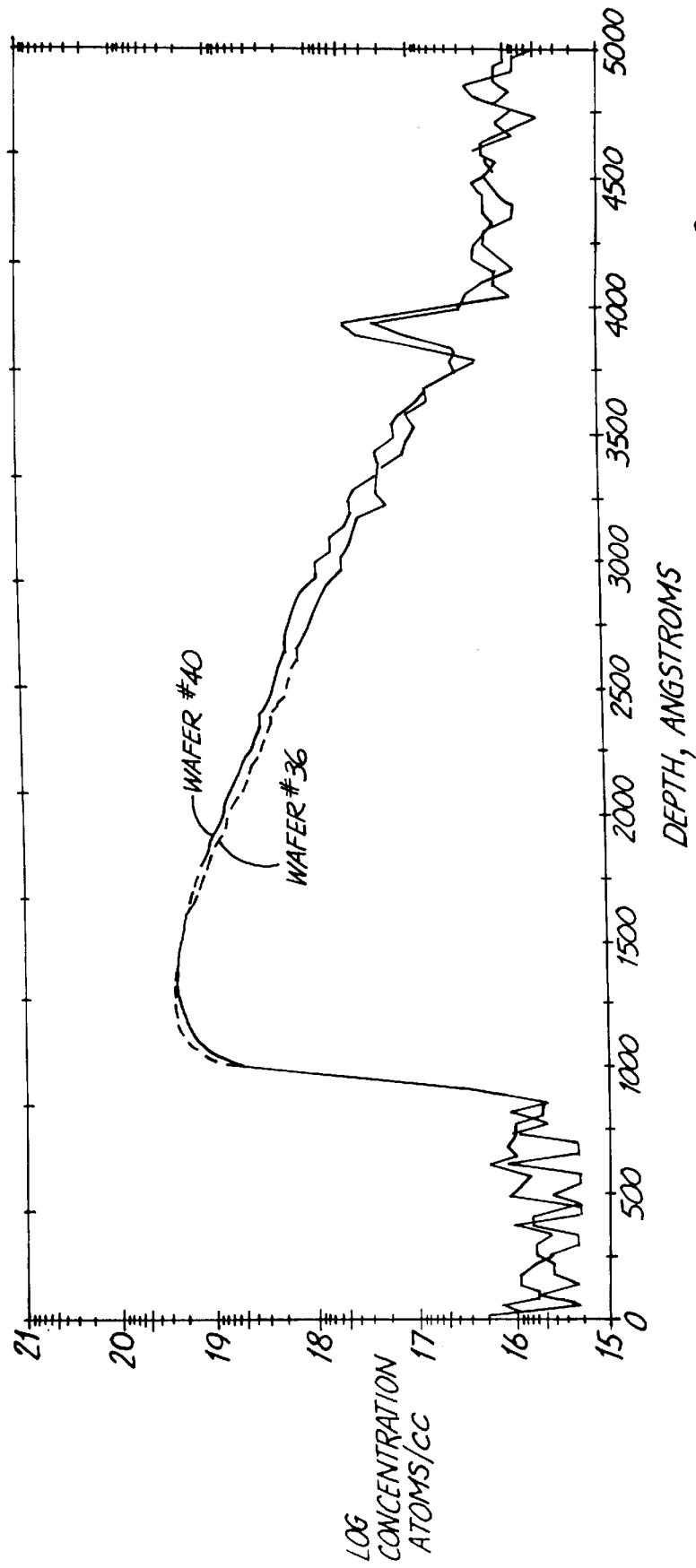

FIGS. 7A–7C graphically illustrates Mg, Ca, Na concentrations, respectively, for wafers #36 and #40. FIG. 7A is a Mg concentration comparison showing decreased concentrations of Mg in wafer #36 using EDP in the slurry. FIG. 7B is a Ca concentration comparison showing slightly decreased concentrations of Ca in wafer #36 processed using EDP in the slurry. FIG. 7C is a Na concentration comparison showing increased concentrations of Na in wafer #36 processed using EDP in the slurry for an initial portion at the interface but which then shows decreases in concentration after a few hundred angstroms.

Figure 8A:
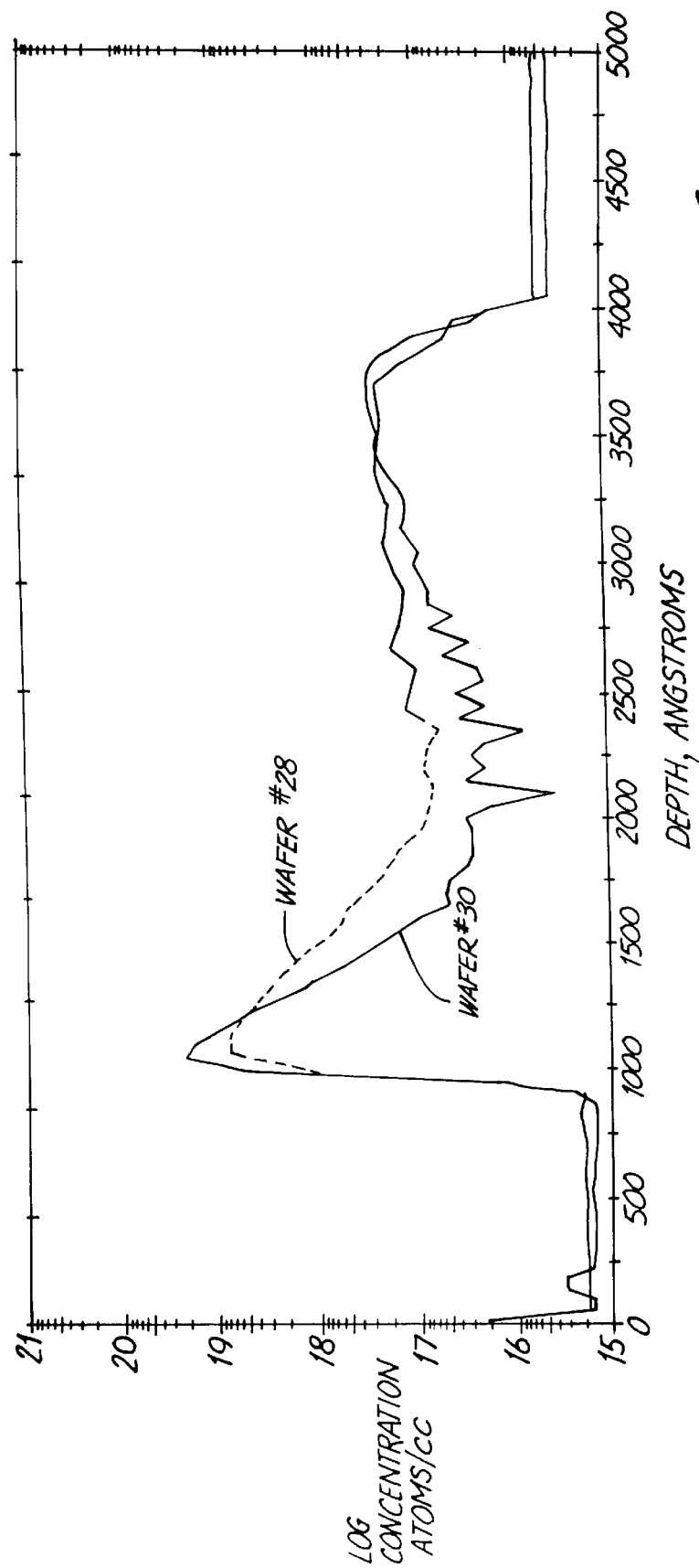
FIG. 8A–8C illustrate spectrographic concentrations of the metal ions Mg, Ca, and Na, respectively, for various wafers tested.
Figure 8B:
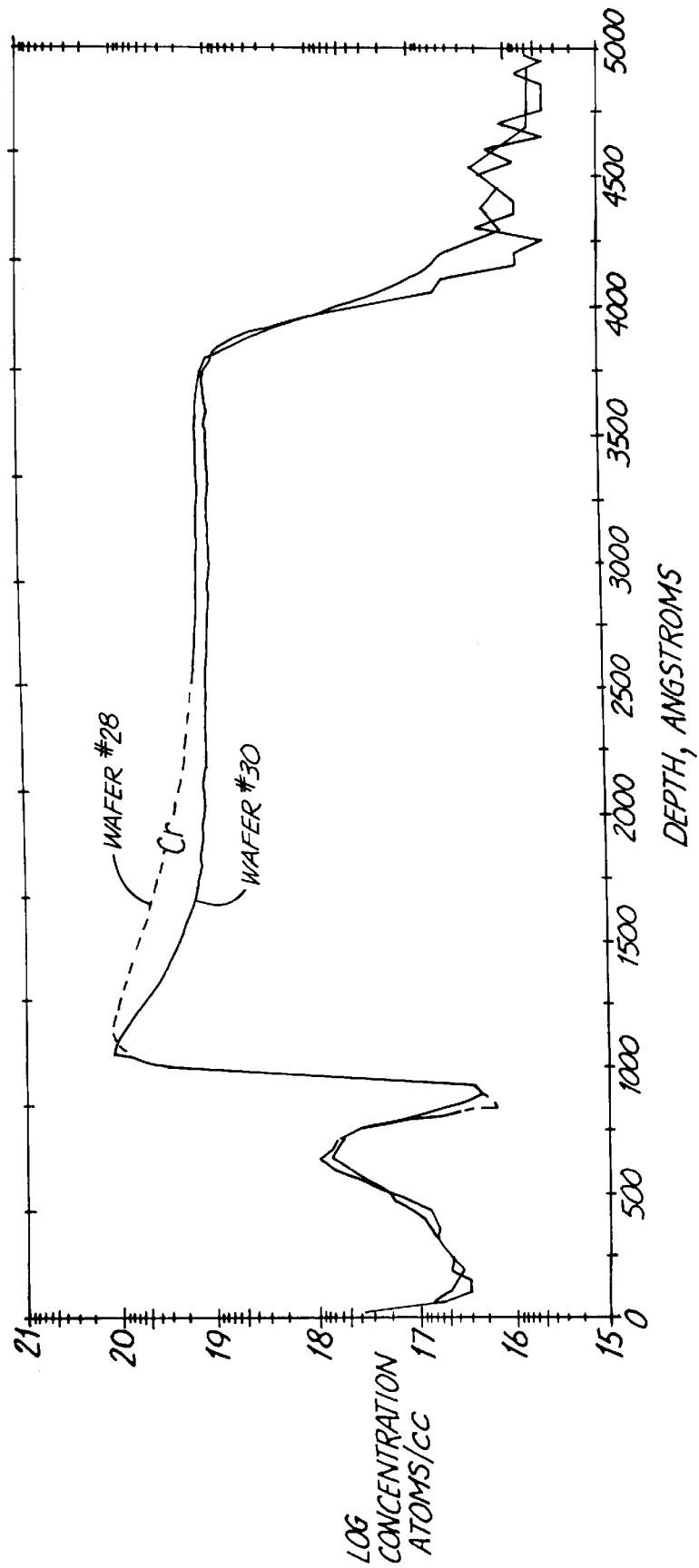
Figure 8C:
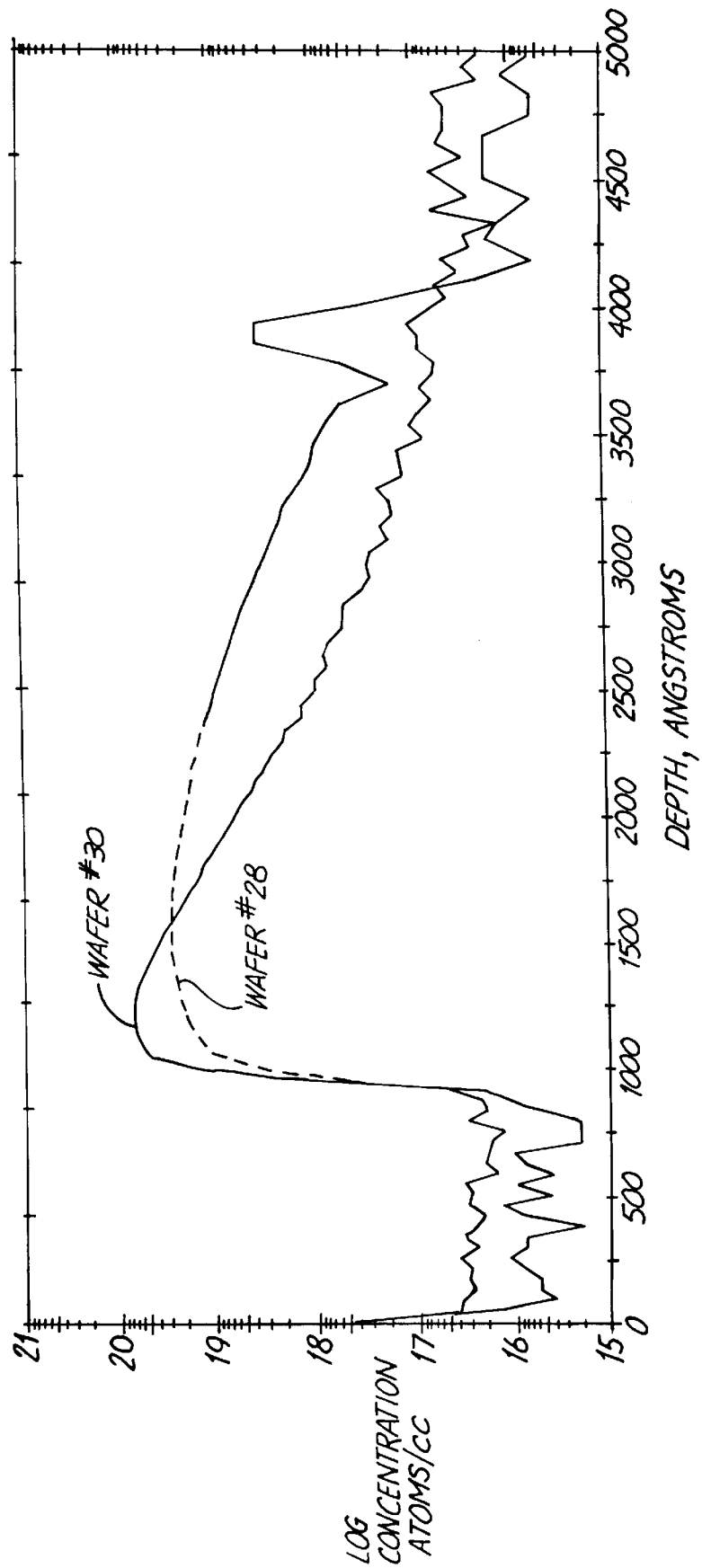

FIGS. 8A–8C graphically illustrates Mg, Ca, Na concentrations, respectively, for wafers #28 and #30. FIG. 8A is a Mg concentration comparison showing decreased concentrations of Mg in wafer #28 processed using EDP in the slurry for a depth next to nitride/BPSG interface; however, the concentration then is increased after about 1200 Å to 1300 Å. FIG. 8B is a Ca concentration comparison showing reduced concentrations of Ca in wafer #28 processed using EDP in the slurry next to the interface depth but then such concentrations are shown to be increased at lower depths. FIG. 8C is a Na concentration comparison showing substantially reduced concentrations of Na in wafer #28 processed using EDP in the slurry.

EXAMPLE 3

In this Example 3, three wafers were subjected to planarization. The CMP process was performed using a Westech CMP planarization unit, Model 472, available from Westech Systems, Inc. All wafers were planarized for 20 seconds. When the conventional slurries were utilized with EDP, the slurry included 0.2 grams of EDP per 2 gallons of conventional slurry. The wafers undergoing planarization were all run with a 5 psi downforce pressure utilizing the wafer holder, a 2 psi backside pressure utilizing the wafer table, table rotation of 33 rpm, carrier or holder rotation of 28 rpm, a 100 ml/mm flowrate of the slurry, and a wafer table or platen temperature of about 115° F. All of the wafers were silicon wafers having BPSG deposited thereon of about 3000 Å. The BPSG layers were doped equally for each wafer. Between the planarization of each wafer, a pad conditioning step was performed which includes running a diamond studded disc across the pad, for a time period of about 75 seconds, to refresh the pad surface. Table 3 gives the matrix of the three wafers submitted for analysis.

TABLE 3

| Wafer# | Pad | Slurry | Time | Thickness (est.) |
|---|---|---|---|---|
| 49 | IC 1000 | ILD 1300 | 20s | 1650 |
| 39 | IC 60 | SC-1 | 20s | 2050 |
| 35 | IC 60 | SC-1 + EDP | 20s | 2050 |

The three BPSG/Si wafers were analyzed with total X-Ray reflectance fluorescence and vapor phase decomposition (TXRF/VPD) as known to one skilled in the art to evaluate contamination differences and the effect of a chelating agent to reduce metallics. The wafers had about 2000 to 3000 Å of BPSG prior to VPD. The VPD process involves decomposition of the wafer silicon oxide layer with HF Vapor, gathering the surface in a collection droplet, and evaporating the droplet. The TXRF is then used to scan the residue composition to determine its content based on known parameters or characteristics of residues.

One measurement was made on each of the wafers over the area of the VPD residue. It should be noted that the VPD residue was liquid on the wafers' surface such that when the wafers were measured on the Censor ANS to locate the residue (x, y coordinates), the residue spun off into a long streak. Since the TXRF spot size is 10 mm, the following TXRF measurements are not inclusive of the entire collection residue concentration. Reported in Table 4 are the element concentrations as detected within the 10 mm measurement area.

TABLE 4

| | | | (10e10 atoms/cm²) | | | | | |
|---|---|---|---|---|---|---|---|---|
| Wafer# | Cl | K | Ca | Cr | Mn | Fe | Ni | Zn |
| 49 | nd | nd | 1100 | nd | 300 | 1000 | 700 | 900 |
| 39 | nd | 400 | 2000 | 300 | 200 | 1800 | 1200 | 3500 |
| 35 | nd | nd | 600 | nd | 90 | 400 | 500 | 1500 |

Data is reported to one significant figure for values less than 1e13, and two significant figures for values greater than 1e13. If an element is not reported, it was not detected (nd). Quantification is achieved by analyzing one or more standards with a known contamination level of one element and calculating area densities for unknown samples using sensitivity factors related to well known fluorescence yields for the elements.

Wafers 39 and 35 were subject to the same processing parameters, except for the addition of EDP to the abrasive slurry for wafer #35. Wafer #35 showed a substantial reduction in metal ion contamination for all metal ions analyzed, with the exception of Cl, which was not detected.

Wafer #49 was processed with an ILD 1300 slurry that is cleaner or more pure (contains less contamination elements) than the SC-1 slurry and with an IC 1000 pad that typically produces less scratches than the IC 60 pad. Therefore, although the wafer #39 and wafer #49 are not directly comparable, the conditions for the #49 wafer were less severe than the #39 wafer and thus, the reduction of concentrations between wafers #39 and #49, except for Mn, provide support and validity to the decreased concentration levels when comparing wafers #35 and #39.

Measurements were made with the Philips TREX 610-T instrument using the W anode x-ray source. Measurement conditions for the W anode were 25 kV, 100 mA, 0.03° glancing angle, and 1000 second integration time. Analyses are performed with the samples in a nitrogen ambient at about 1 Torr. The analysis area is 10 mm in diameter and the analysis depth is a few tens of angstroms for polished silicon surfaces.

Although the invention has been described with particular reference to a preferred embodiment thereof, variations and modifications of the present invention can be made within a contemplated scope of the following claims as is readily known to one skilled in the art.

What is claimed is:

1. A planarization method comprising the steps of:

providing a wafer having a wafer surface;

positioning a pad for contact with the wafer surface; and planarizing the wafer surface using the pad and a fluid composition, the fluid composition including a chelating agent, wherein the chelating agent is 1,2-ethylenediphosphonic acid (EDP), and further wherein the chelating agent reduces a concentration of uncomplexed metal ions for at least one metal of a plurality of metals with respect to the wafer as compared to the concentration of uncomplexed metal ions for the at least one metal when the chelating agent is not used in the planarization of the wafer surface while maintaining substantially a same or greater planarization rate when the chelating agent is used compared to a planarization rate when the chelating agent is not used.

2. The method according to claim 1, wherein the EDP of the fluid composition is of an amount less than about 0.5% by weight of the total weight of the fluid composition.

3. The method according to claim 2, wherein the EDP of the fluid composition is of an amount less than about 0.1% by weight of the total weight of the fluid composition.

4. The method according to claim 1, wherein the pad includes an abrasive component.

5. The method according to claim 1, wherein the fluid composition includes a slurry including an abrasive component.

* * * * *